United States Patent
Morein

(10) Patent No.: US 11,545,366 B2
(45) Date of Patent: Jan. 3, 2023

(54) PROCESS MONITOR FOR WAFER THINNING

(71) Applicant: Synaptics Incorporated, San Jose, CA (US)

(72) Inventor: Stephen L. Morein, San Jose, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 51 days.

(21) Appl. No.: 17/340,944

(22) Filed: Jun. 7, 2021

(65) Prior Publication Data

US 2021/0296138 A1  Sep. 23, 2021

Related U.S. Application Data

(62) Division of application No. 16/119,543, filed on Aug. 31, 2018, now Pat. No. 11,056,351.

(51) Int. Cl.
| | |
|---|---|
| *H01L 21/304* | (2006.01) |
| *B24B 37/013* | (2012.01) |
| *H01L 21/321* | (2006.01) |
| *H01L 21/66* | (2006.01) |
| *B24B 49/10* | (2006.01) |
| *H01L 21/683* | (2006.01) |
| *H01L 21/306* | (2006.01) |
| *B24B 37/04* | (2012.01) |

(52) U.S. Cl.
CPC ........ *H01L 21/3212* (2013.01); *B24B 37/013* (2013.01); *B24B 37/04* (2013.01); *B24B 49/10* (2013.01); *H01L 21/304* (2013.01); *H01L 21/30625* (2013.01); *H01L 21/683* (2013.01); *H01L 22/12* (2013.01); *H01L 22/14* (2013.01); *H01L 22/26* (2013.01)

(58) Field of Classification Search
CPC ....... B24B 37/013; B24B 37/04; H01L 49/10; H01L 21/3212; H01L 21/30625; H01L 22/26; H01L 22/14
See application file for complete search history.

(56) References Cited

U.S. PATENT DOCUMENTS

| | | | |
|---|---|---|---|
| 8,553,422 B2 | 10/2013 | Zhao et al. | |
| 9,281,253 B2 | 3/2016 | Xu et al. | |
| 10,727,214 B2 * | 7/2020 | Morein | H01L 23/5386 |
| 2015/0224623 A1 * | 8/2015 | Xu | B24B 49/04 |
| | | | 451/5 |
| 2015/0371913 A1 * | 12/2015 | Lu | H01L 21/3212 |
| | | | 438/11 |
| 2018/0304435 A1 | 10/2018 | Xu et al. | |
| 2019/0143474 A1 | 5/2019 | Wang et al. | |
| 2019/0148191 A1 | 5/2019 | Wang et al. | |
| 2019/0164851 A1 | 5/2019 | Yoo et al. | |
| 2019/0389028 A1 * | 12/2019 | Lu | B24B 37/27 |

* cited by examiner

*Primary Examiner* — Savitri Mulpuri
(74) *Attorney, Agent, or Firm* — Paradice & Li LLP

(57) ABSTRACT

A system and method for thinning an integrated circuit (IC) wafer. The system includes a support structure to hold the IC wafer and a mechanism to operate on the IC wafer. The support structure includes one or more inductive coils configured to transmit a power signal to the IC wafer and receive a feedback signal from the IC wafer. The system further includes a process controller to control the operation based at least in part on the feedback signal received from the IC wafer.

14 Claims, 10 Drawing Sheets

PROCESS MONITOR FOR WAFER THINNING

CROSS-REFERENCE TO RELATED APPLICATION

This application is a divisional of U.S. application Ser. No. 16/119,543 filed Aug. 31, 2018, entitled "PROCESS MONITOR FOR WAFER THINNING," the entirety of which is incorporated by reference herein.

TECHNICAL FIELD

The present embodiments relate generally to integrated circuit (IC) devices, and specifically to processes for thinning IC wafers.

BACKGROUND OF RELATED ART

The manufacture of integrated circuit (IC) devices involves a wafer fabrication process in which circuit components (e.g., resistors, diodes, transistors, etc.) and their interconnections are formed on a single wafer of semiconductor substrate). The size and number of circuit components that can be fabricated on a single wafer of silicon may be determined by the process node used during the fabrication process. For example, a smaller process node may produce smaller circuit components that are faster and more power-efficient than similar circuit components produced by a larger process node. Thus, the process node used to manufacture the wafer may be optimized for the type of device. For example, larger process nodes may be used to manufacture devices having larger circuit components and/or greater power consumption whereas smaller process nodes may be used to manufacture devices having smaller circuit components and/or less power consumption.

Wafer thinning is a process for removing material (e.g., layers of substrate and/or impurities) from the surface of a semiconductor wafer. Example wafer thinning techniques include backgrinding and chemical mechanical planarization (CMP). Wafer thinning may be used to smooth or polish the surface of an IC wafer prior to adding an additional layer of substrate and/or circuitry to the surface of the wafer. Wafer thinning may also be used to reduce the thickness of an IC wafer to a desired level of thickness. However, thinning an IC wafer may alter the electrical characteristics of the wafer. More specifically, over-thinning the IC wafer may cause one or more circuit components to fail. Thus, it may be desirable to monitor the wafer thinning process to prevent over-thinning.

SUMMARY

This Summary is provided to introduce in a simplified form a selection of concepts that are further described below in the Detailed Description. This Summary is not intended to identify key features or essential features of the claims subject matter, nor is it intended to limit the scope of the claimed subject matter.

A system and method for operating on an integrated circuit (IC) wafer. The system includes a support structure to hold the IC wafer and a mechanism to operate on the IC wafer. For example, the mechanism may comprise a substrate removal mechanism configured to remove the layers of material from a surface of the IC wafer using backgrinding or chemical mechanical polishing (CMP) techniques. The support structure includes one or more inductive coils configured to transmit a power signal to the IC wafer and receive a feedback signal from the IC wafer. The system further includes a process controller to control the operation based at least in part on the feedback signal received from the IC wafer.

In some implementations, the process controller may monitor a characteristic of the received feedback signal and operate the substrate removal mechanism to remove layers of material from the surface of the IC wafer until the monitored characteristic reaches a threshold level. In some aspects, the feedback signal may be generated by a resistance-capacitance (RC) oscillator, provided on the IC wafer, in response to the power signal. Thus, the process control may be configured to stop the substrate removal mechanism from removing additional layers of the IC wafer when a frequency of the feedback signal reaches a threshold frequency.

In some implementations, the process controller may determine a resistance of the material based at least in part on the monitored characteristic. Thus, in some aspects, the process controller may stop the substrate removal mechanism from removing additional layers of the IC wafer when the resistance of the material reaches a threshold resistance. In some other implementations, the process controller may determine a thickness of the IC wafer based at least in part on the monitored characteristic. Thus, in some aspects, the process controller may stop the substrate removal mechanism from removing additional layers of the IC wafer when the thickness of the IC wafer reaches a threshold thickness.

Still further, in some implementations, the support structure may be configured to transmit a plurality of power signals to the IC wafer, where each of the power signals is transmitted to a different region of the IC wafer. The support structure may further receive a respective feedback signal from each of the regions of the IC wafer. Thus, in some aspects, the process controller may stop the substrate removal mechanism from removing additional layers of the IC wafer when the monitored characteristic for at least one of the received feedback signals reaches the threshold level. In some other aspects, the process controller may stop the substrate removal mechanism from removing additional layers of the IC wafer only when the monitored characteristic for each of the received feedback signals reaches the threshold level.

BRIEF DESCRIPTION OF THE DRAWINGS

The present embodiments are illustrated by way of example and are not intended to be limited by the figures of the accompanying drawings.

DETAILED DESCRIPTION

Figure 1:
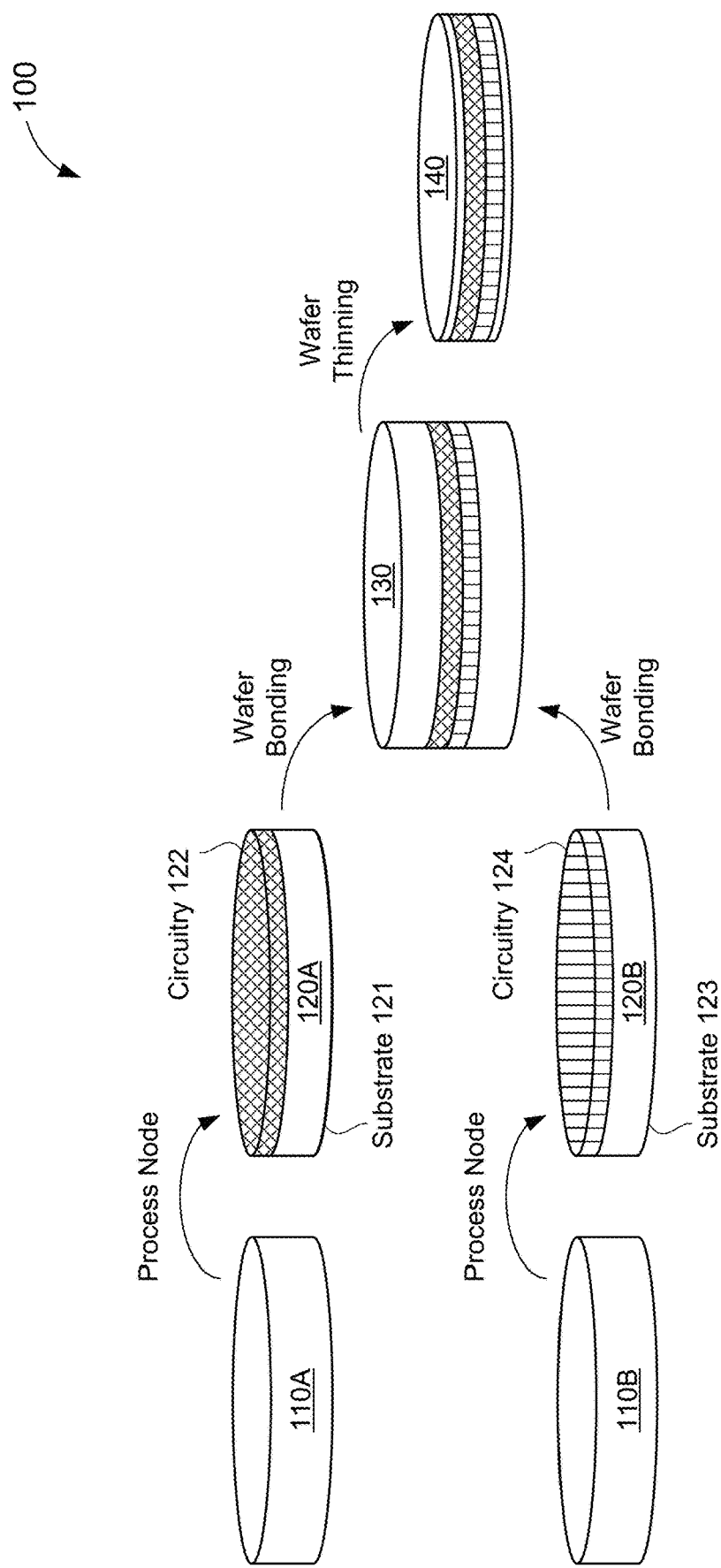
FIG. 1 shows an example process of manufacturing a three-dimensional (3D) integrated circuit (IC) device, in accordance with some embodiments.

In the following description, numerous specific details are set forth such as examples of specific components, circuits, and processes to provide a thorough understanding of the present disclosure. The term "coupled" as used herein means connected directly to or connected through one or more intervening components or circuits. The terms "electronic system" and "electronic device" may be used interchangeably to refer to any system capable of electronically processing information. Also, in the following description and for purposes of explanation, specific nomenclature is set forth to provide a thorough understanding of the aspects of the disclosure. However, it will be apparent to one skilled in the art that these specific details may not be required to practice the example embodiments. In other instances, well-known circuits and devices are shown in block diagram form to avoid obscuring the present disclosure. Some portions of the detailed descriptions which follow are presented in terms of procedures, logic blocks, processing and other symbolic representations of operations on data bits within a computer memory.

These descriptions and representations are the means used by those skilled in the data processing arts to most effectively convey the substance of their work to others skilled in the art. In the present disclosure, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system. It should be borne in mind, however, that all of these and similar terms are to be associated with the appropriate physical quantities and are merely convenient labels applied to these quantities.

Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps have been described below generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium comprising instructions that, when executed, performs one or more of the methods described above. The non-transitory processor-readable data storage medium may form part of a computer program product, which may include packaging materials.

The non-transitory processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor.

The various illustrative logical blocks, modules, circuits and instructions described in connection with the embodiments disclosed herein may be executed by one or more processors. The term "processor," as used herein may refer to any general purpose processor, conventional processor, controller, microcontroller, and/or state machine capable of executing scripts or instructions of one or more software programs stored in memory. The term "voltage source," as used herein may refer to a direct-current (DC) voltage source, an alternating-current (AC) voltage source, or any other means of creating an electrical potential (such as ground).

FIG. 1 shows an example process 100 of manufacturing a three-dimensional (3D) integrated circuit (IC) device 140, in accordance with some embodiments. The process 100 begins with two separate semiconductor wafers 110A and 110B. For example, the wafers 110A and 110B may be formed from silicon or any other suitable semiconductor material (e.g., gallium arsenide). In the example of FIG. 1, the 3D IC device 140 is formed from two semiconductor wafers. However, in actual implementations, a 3D IC device may be formed using any number of semiconductor wafers.

First circuitry 122 is added to the top surface of the first wafer 110A to produce a first IC wafer 120A. In some embodiments, the first circuitry 122 may include digital circuit components such as, for example, resistors, transistors, diodes, and/or other circuit components that may be used in digital applications. In some embodiments, all of the digital circuitry for the 3D IC device 140 may be provided on the first IC wafer 120A. Thus, in some aspects, the first IC wafer 120A may be fabricated using a process node that is optimized for manufacturing digital components. For example, the first circuitry 122 may have relatively low power requirements (e.g., 1V transistors). Thus, in some embodiments, a small (e.g., 28, 40, or 55 nm) low-power (LP) or embedded-flash (EF) process may be used to produce the first circuitry 122 on the first IC wafer 120A. As shown in FIG. 1, the top surface of the first IC wafer 120A includes the first circuitry 122 whereas the bottom surface of the first wafer IC 120A may comprise a semiconductor substrate 121 with no exposed circuitry.

Second circuitry 124 is added to the top surface of the second wafer 110б to produce a second IC wafer 120B. The second circuitry 124 may include analog circuit components to be used in analog applications. In some embodiments, all of the analog circuitry for the 3D IC device 140 may be provided on the second IC wafer 120B. Thus, in some aspects, the second IC wafer 120B may be fabricated using a process node that is optimized for manufacturing analog components. For example, the second circuitry 124 may have relatively high power requirements (e.g., 6V or 32V transistors). Thus, in some embodiments, a larger (e.g., 0.8 μm) high-voltage (HV) process may be used to produce the second circuitry 124 on the second IC wafer 120B. As shown in FIG. 1, the top surface of the second IC wafer 120B includes the second circuitry 124 whereas the bottom surface of the second IC wafer 120б may comprise a semiconductor substrate 123 with no exposed circuitry.

The first IC wafer 120A is then bonded to the second IC wafer 120B to produce a stacked wafer 130. For example, the IC wafers 120A and 120B may be vertically aligned (e.g., in a stacked configuration) with the top surface of the first IC wafer 120A facing the top surface of the second IC wafer 120B (e.g., with the first circuitry 122 facing the second circuitry 124). The IC wafers 120A and 120B are then bonded face-to-face using known wafer bonding techniques. During the bonding process, the first circuitry 122 may be coupled to the second circuitry 124 using bonding pads, routing traces, through-silicon vias (TSVs), and/or various other interconnects.

It is noted that bonding the IC wafers 120A and 120B face-to-face seals the circuitry 122 and 124 inside the stacked wafer 130. For example, as shown in FIG. 1, the bottom surface (e.g., substrate 121) of the first IC wafer 120A may form the top surface of the stacked wafer 130 and the bottom surface (e.g., substrate 123) of the second IC wafer 120B may form the bottom surface of the stacked wafer 130. Thus, the circuitry 122 and 124 is fully contained between the layers of substrate 121 and 123. Since the circuitry 122 and 124 within the stacked wafer 130 is not exposed (e.g., cannot be seen) on the top surface or the bottom surface of the stacked wafer 130, the stacked wafer 130 embodiment of FIG. 1 may provide greater protection to the circuitry 122 and 124 contained therein.

Finally, the stacked wafer 130 may be thinned down to produce the 3D IC device 140. For example, the stacked wafer 130 may be thinned down to a desired thickness, such as the thickness of a single semiconductor wafer (e.g., wafer 110A or 110B). During the wafer thinning process, material or substrate from the exposed sides of the stacked wafer 130 may be removed using known backgrinding or chemical mechanical polishing (CMP) techniques. In some embodiments, the wafer thinning process may be used to produce (or complete the fabrication of) one or more circuit components of the 3D IC device 140. As described in greater detail below, the wafer thinning process may separate the substrate 121 and/or substrate 123 into discrete portions, thereby isolating individual circuit components (e.g., belonging to the first circuitry 122 and/or the second circuitry 124) from one another.

In the example of FIG. 1, wafer thinning is performed after wafer bonding. However, in actual implementations, the second IC wafer 120B and/or the first IC wafer 120A may be thinned prior to bonding. In some embodiments, the analog side of the stacked wafer 130 (e.g., corresponding to second IC wafer 120B) may be thinned first, to complete the fabrication of one or more analog circuit components, and the digital side of the stacked wafer 130 (e.g., corresponding to first IC wafer 120A) may then be thinned down to the desired overall thickness of the 3D IC device 140. In other embodiments, the digital side of the stacked wafer 130 may be thinned first, to complete the fabrication of one or more digital circuit components, and the analog side of the stacked wafer 130 may then be thinned down to the desired overall thickness of the 3D IC device 140.

The 3D IC device 140 offers several advantages over conventional (e.g., monolithic) 3D devices. As described above, the process node used to manufacture a monolithic wafer may be deterministic of the size and/or number of circuit components on the wafer. As a result of fabricating both analog and digital circuitry using the same process node, the analog circuitry may be fabricated using a process node that is smaller than necessary (e.g., incurring high manufacturing costs) or the digital circuitry may be fabricated using a process node that is larger than necessary (e.g., producing larger and less-efficient circuitry). Aspects of the present disclosure recognize that, by manufacturing the 3D IC device 140 on multiple semiconductor wafers (e.g., wafers 110A and 110B), the digital circuitry (e.g., first circuitry 122) and analog circuitry (e.g., second circuitry 124) may be fabricated using different process nodes. More specifically, the digital circuitry may be fabricated using a process that is optimized for digital circuit components (e.g., 28/40/55 LP/EF) and the analog circuitry may be fabricated using a process that is optimized for analog circuit components (e.g., 80 HV). This may reduce manufacturing costs while ensuring optimal performance of the 3D IC device 140.

Among other advantages, the 3D IC device 140 also protects the circuitry therein by encapsulating the circuitry 122 and 124 on the inside (e.g., unexposed portion) of the IC device 140. Further, the wafer thinning process may electrically isolate circuit components of the 3D IC device 140 by removing at least a portion of the substrate interconnecting the components. This may allow for a denser packing of first circuitry 122 and/or second circuitry 124 on the 3D IC device 140, which may allow a greater number chips or die to be cut from the 3D IC device 140. As a result, the process 100 may further reduce the manufacturing costs of individual 3D IC chips.

Aspects of the present disclosure recognize that over-thinning an IC wafer may cause one or more circuit components to fail. Thus, in some embodiments, the system used for wafer thinning may include a process controller configured to monitor a thickness of the IC wafer while removing layers of material (e.g., semiconductor, metal, and/or other types materials) from the surface of the IC wafer. In some aspects, the wafer-thinning system may communicate inductively with the IC wafer being thinned (e.g., via inductive coils residing on each of the wafer thinning system and the IC wafer itself). More specifically, the IC wafer may communicate feedback information to the wafer-thinning system (e.g., via the inductive coils) indicating a thickness of the IC wafer at any given time. In some aspects, the wafer-thinning system may stop removing layers of material from the surface of the IC wafer once the feedback information indicates that the thickness of the IC wafer has been reduced to a desired level.

Figure 2:
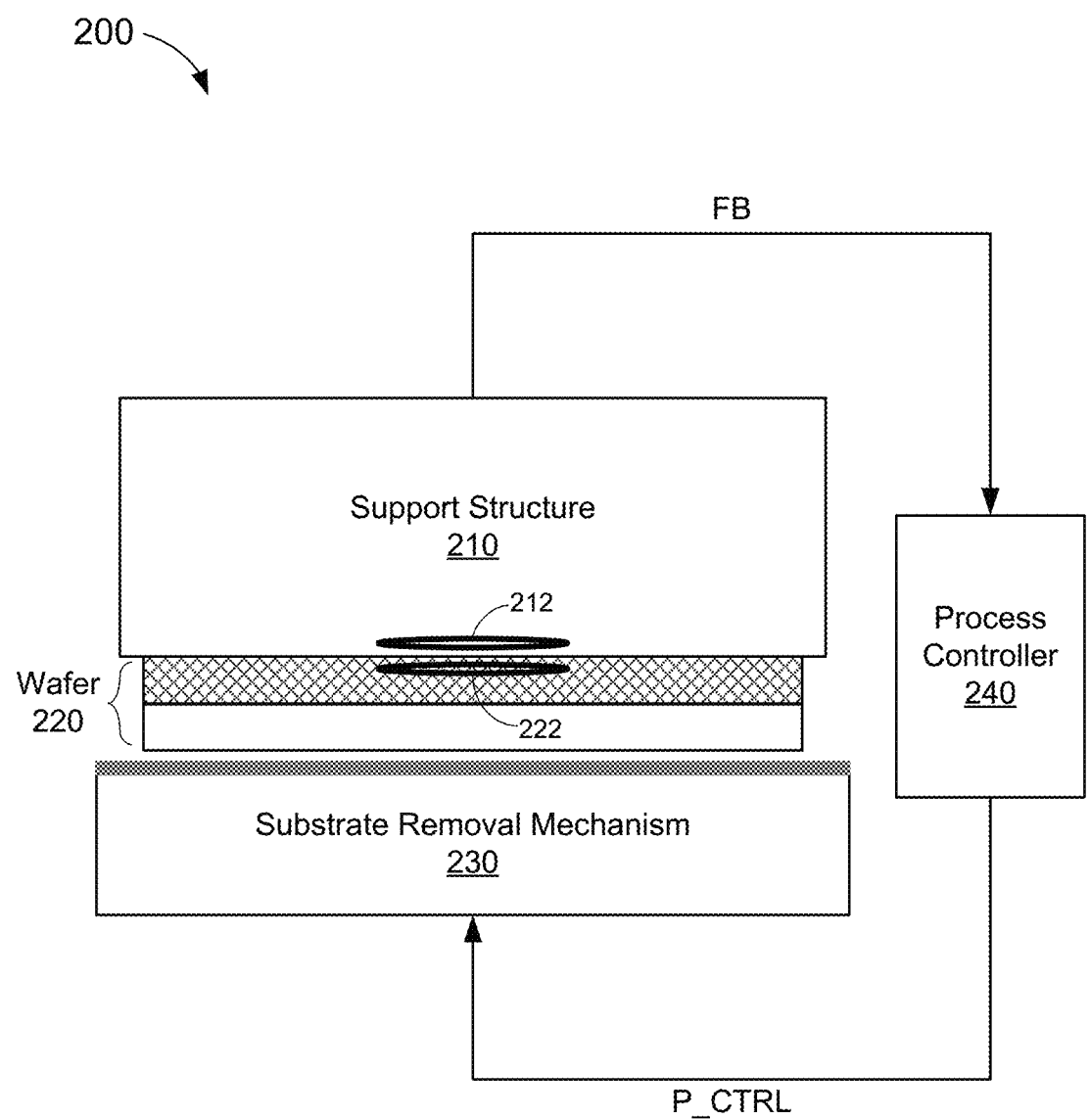
FIG. 2 shows a block diagram of a wafer-thinning system with process control circuitry, in accordance with some embodiments.

FIG. 2 shows a block diagram of a wafer-thinning system 200 with process control circuitry, in accordance with some embodiments. The wafer-thinning system 200 includes a support structure 210, a substrate removal mechanism 230, and a process controller 240. The support structure 210 may hold, or otherwise support, an IC wafer 220 to be thinned. For example, the support structure 210 may apply force or pressure to the IC wafer 220, pressing a surface of the IC wafer 220 against a corresponding surface of the substrate removal mechanism 230. The substrate removal mechanism 230 may remove layers of material (e.g., semiconductor, metal, and/or other types materials) from the surface of the wafer 220 using various wafer thinning techniques (such as backgrinding, CMP, etching and the like).

In some embodiments, the support structure 210 may include one or more inductive coils 212 that are configured to communicate (e.g., inductively) with corresponding inductive coils 222 residing on the IC wafer 220. More specifically, in some aspects, the support structure 210 may supply power to the IC wafer 220 "wirelessly" via inductive coupling between the coils 212 and 222. For example, a power source coupled to (or residing within) the support structure 210 may send an electrical current to the inductive coil 212, which induces a corresponding current in the inductive coil 222 that may be used to power circuitry residing on the IC wafer 220.

In some embodiments, at least some of the circuitry residing on the IC wafer 220 may be used to measure one or more characteristics or properties of the wafer 220. For example, in some aspects, the one or more characteristics may indicate a thickness of the IC wafer 220. In some other aspects, the one or more characteristics may indicate a resistance of the semiconductor substrate (or the IC wafer 220). In some embodiments, the IC wafer 220 may communicate a feedback signal (FB) to the support structure 210, via inductive coupling between the coils 212 and 222 (e.g., or a different set of coils), based on the measured characteristics. More specifically, the feedback signal may be used to communicate the measured characteristics of the wafer 220 to the process controller 240.

The process controller 240 may monitor a progress of the thinning operation based at least in part on the feedback signal received from the IC wafer 220. In some embodiments, the process controller 240 may control an operation of the substrate removal mechanism 230 based on the characteristics of the IC wafer 220 indicated by the feedback signal. For example, the process controller 240 may ensure that the IC wafer 220 is thinned until the measured characteristics (as indicated by the feedback signal) reach a desired threshold level. Furthermore, the process controller 240 may prevent the substrate removal mechanism 230 from over-thinning the IC wafer 220. In some aspects, the process controller 240 may control the operation of the substrate removal mechanism 230 using a process control signal (P_CTRL). For example, the process control signal may be asserted (or deasserted) to stop or pause the operation of the substrate removal mechanism 230.

In some embodiments, the process controller 240 may ensure that the IC wafer 220 is thinned to a threshold thickness. For example, the process controller 240 may monitor the thickness of the IC wafer 220 based on the feedback signal. In some aspects, the process controller 240 may enable the substrate removal mechanism 230 to remove layers of material from the surface of the IC wafer 220 (e.g., by deasserting P_CTRL) as long as the threshold thickness has not been reached. Once the threshold thickness is reached, the process controller 240 may disable the substrate removal mechanism 230 from removing additional layers of material from the surface of the IC wafer 220 (e.g. by asserting P_CTRL).

In some other embodiments, the process controller 240 may ensure that the IC wafer 220 is thinned to a threshold resistance. For example, the process controller 240 may monitor a resistance of the semiconductor substrate (e.g., of the IC wafer 220) based on the feedback signal. In some aspects, the process controller 240 may enable the substrate removal mechanism 230 to remove layers of material from the surface of the IC wafer 220 (e.g., by deasserting P_CTRL) as long as the threshold resistance has not been reached. Once the threshold resistance is reached, the process controller 240 may disable the substrate removal mechanism 230 from removing additional layers of material from the surface of the IC wafer 220 (e.g. by asserting P_CTRL).

It is noted that, in some implementations, the inductive coils 212 and 222 provide a closed-loop circuit for actively monitoring a wafer thinning process (such as performed by the wafer-thinning system 200). Aspects of the present disclosure further recognize that the active process monitoring techniques described herein may also be used to control other operations that may be performed on an IC wafer. For example, the inductive coils 222 may be coupled to circuitry that measures various other properties of the IC wafer 220. Accordingly, the feedback signals provided by the inductive coils 212 may be used to control other mechanisms (e.g., tools) configured to operate on the IC wafer 220 based on the measured properties of the IC wafer 220.

Figure 3:
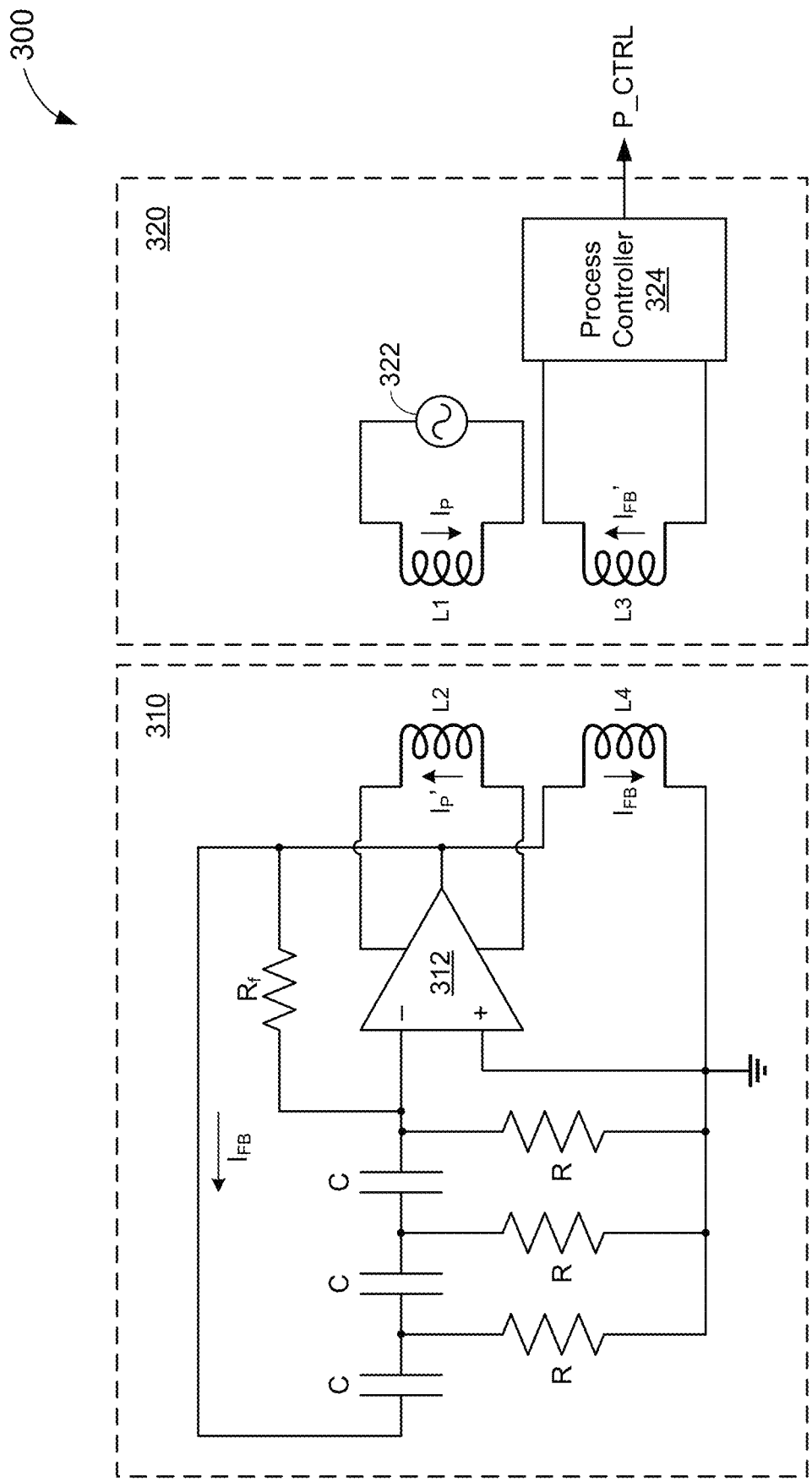
FIG. 3 shows a circuit diagram of a process control system for wafer thinning, in accordance with some embodiments.

FIG. 3 shows a circuit diagram of a process control system 300 for wafer thinning, in accordance with some embodiments. The process control system 300 includes wafer measurement circuitry 310 and thinning control circuitry 320. The wafer measurement circuitry 310 may reside on an IC wafer such as, for example, the IC wafer 220 of FIG. 2. The thinning control circuitry 320 may reside, at least in part, on a wafer thinning apparatus such as, for example, the support structure 210 of FIG. 2. In example embodiments, the process control system 300 may be used to monitor and control a wafer thinning operation (e.g., to prevent over-thinning of the IC wafer).

The thinning control circuitry 320 includes an inductor L1 coupled to a power source 322 and another inductor L3 coupled to a process controller 324. Each of the inductors L1 and L3 may be disposed within a support structure of the wafer-thinning system. More specifically, the inductors L1 and L3 may be inductively coupled to respective inductors L2 and L4 residing on the IC wafer being thinned. In some embodiments, the power source 322 and process controller 324 may be external to the wafer-thinning system. In some other embodiments, one or more of the power source 322 or the process controller 324 may be disposed within the support structure.

The wafer measurement circuitry 310 includes a plurality of resistances (R) and capacitances (C) (referred to herein as an "RC network") coupled to an amplifier 312. In the example of FIG. 3, the amplifier 312 is an operational amplifier ("op amp"). The voltage supply terminals of the amplifier 312 are coupled to inductor L2 and the output of the amplifier 312 is coupled to inductor L4. The inverting input (−) terminal of the amplifier 312 is coupled to the RC network and the non-inverting input (+) terminal of the amplifier 312 is coupled to a ground potential. In some aspects, the output terminal of the amplifier 312 may be further coupled to the inverting input terminal of the amplifier 312, via a feedback resistor (R$_f$), in a negative feedback configuration.

In operation, the thinning control circuitry 320 may supply power to, and receive feedback from, the wafer measurement circuitry 310. For example, the power source 322 may generate a power signal or current (I$_P$). The flow of current I$_P$ through the inductor L1 induces a corresponding current I$_P$' through the inductor L2 of the wafer measurement circuitry 310 (e.g., when the IC wafer is being held or supported by the support structure of the wafer-thinning system), which powers the amplifier 312. The amplifier 312 outputs a feedback signal or current (I$_{FB}$) which is repeatedly cycled through the RC network and amplified by the amplifier 312.

In some embodiments, the wafer measurement circuitry 310 may operate as an RC oscillator. For example, each "stage" (e.g., resistance-capacitance pair) of the RC network applies a respective phase shift to the feedback signal I$_{FB}$. In the example of FIG. 3, the RC network is shown to include only three stages. However, in actual implementations, the RC network may include any number of stages (e.g., to further improve the frequency stability of the oscillator). The amplifier 312 also shifts the phase of the feedback signal I$_{FB}$ (e.g., by 180°) at its output. By applying a corresponding phase shift (e.g., another 180°) through the RC network, the feedback signal I$_{FB}$ at the end of the feedback loop reinforces the feedback signal I$_{FB}$ at the beginning of the feedback loop (e.g., resulting in positive feedback).

In some embodiments, at least a portion of the resistance in each stage of the RC network may be measured across two (or more) points on the semiconductor substrate of the IC wafer. For example, the resistive component (R) of the RC network may correspond to a resistivity of the semiconductor substrate. Thus, as layers of semiconductor material are removed from the surface of the IC wafer, the resistive component of the wafer measurement circuitry 310 may change. This change in resistance may be reflected in one or more characteristics of the feedback signal I$_{FB}$. For example, the oscillation frequency (f) of the feedback signal I$_{FB}$ may be defined as:

$$f = \frac{1}{2\pi RC\sqrt{2N}}$$

Where R and C represent the resistance and capacitance in each stage of the RC network, and N represents the total number of stages in the RC network.

It is noted from the equation above that the oscillation frequency f is inversely proportional to the resistance of the RC oscillator (e.g., the wafer measurement circuitry 310). Aspects of the present disclosure also recognize that the resistance (R) measured across the semiconductor substrate may increase as the substrate is thinned (e.g., since R is inversely proportional to the cross-sectional area of the semiconductor substrate). This increase in the resistance of the RC oscillator results in a corresponding decrease in the oscillation frequency of the feedback signal I$_{FB}$.

When the feedback signal I$_{FB}$ at the output of the amplifier 312 flows through the inductor L3, a corresponding feedback signal I$_{FB}$' is induced in the inductor L4 of the thinning control circuitry 320 (e.g., residing on the support structure of the wafer-thinning system). In some embodiments, the feedback signal I$_{FB}$' is received and monitored by the process controller 324. More specifically, the process controller 324 may be an example embodiment of the process controller 240 of FIG. 2. Thus, the process controller 324 may control an operation of a substrate removal mechanism (such as the substrate removal mechanism 230 of FIG. 2) based on one or more characteristics of the feedback signal I$_{FB}$'.

As described above, the oscillation frequency of the feedback signal I$_{FB}$ (and thus the induced feedback signal I$_{FB}$') decreases as the thickness of the IC wafer is reduced. Thus, in some aspects, the process controller 324 may monitor the thickness of the IC wafer based on the oscillation frequency of the feedback signal I$_{FB}$'. For example, the process controller 324 may enable the substrate removal mechanism to remove layers of substrate material from the surface of the IC wafer (e.g., by deasserting P_CTRL) as long as the oscillation frequency of the feedback signal I$_{FB}$' is below a threshold frequency (e.g., corresponding to a threshold thickness of the IC wafer). The process controller 324 may stop or prevent the substrate removal mechanism from removing additional layers of semiconductor material from the IC wafer (e.g., by asserting P_CTRL) when the oscillation frequency of the feedback signal I$_{FB}$' reaches the threshold frequency.

In some embodiments, the process controller 324 may also monitor a resistance of the semiconductor substrate (e.g., between two or more points on the substrate). As described above, the oscillation frequency is inversely proportional to the resistance of semiconductor substrate. Thus, in some aspects, the process controller 324 may stop or prevent the substrate removal mechanism from removing additional layers of semiconductor material from the IC wafer when the resistance measured across the semiconductor substrate reaches a threshold resistance value. As described in greater detail below, the threshold resistance may correspond to a resistance that electrically isolates one or more circuit components from other circuit components on the IC wafer. In other words, the process controller 324 may stop or prevent the substrate removal mechanism from removing additional layers of semiconductor material from the IC wafer once the circuit components are effectively isolated.

Figure 4:
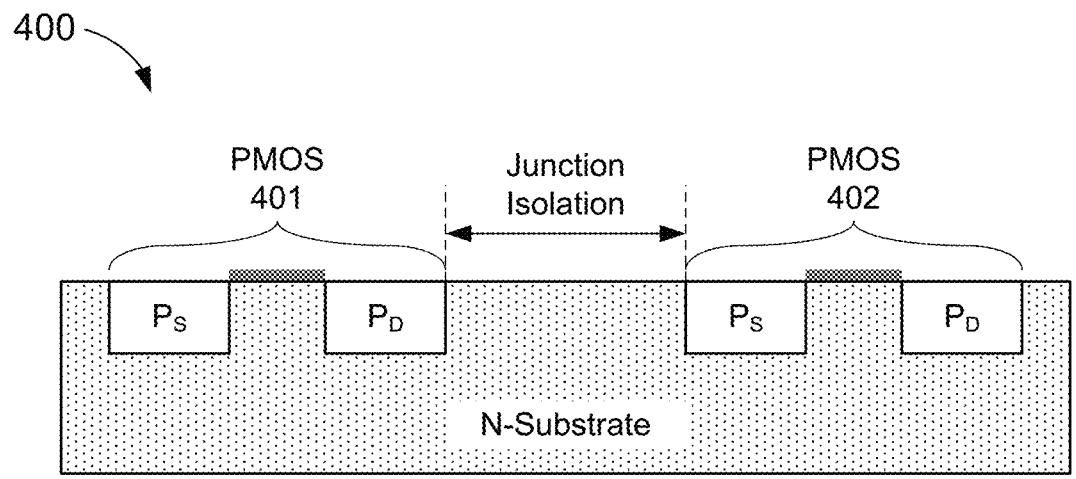
FIG. 4 shows a cross-sectional view of a semiconductor wafer in which neighboring circuits are separated using junction isolation techniques.

FIG. 4 shows a cross-sectional view of a semiconductor wafer 400 in which neighboring circuits are separated using junction isolation techniques. The semiconductor wafer 400 may be an example embodiment of the first IC wafer 120A or the second IC wafer 120B of FIG. 1. Thus, in some embodiments, the semiconductor wafer 400 may include the digital circuit components of a 3D IC device (e.g., corresponding to digital circuitry 122). In other embodiments, the semiconductor wafer 400 may include the analog circuit components of a 3D IC device (e.g., corresponding to analog circuitry 124).

The semiconductor wafer 400 is formed from an N-type (negatively-doped) semiconductor substrate. Two P-type (positively-doped) semiconductor regions are deposited on either side of the substrate to form respective P-type metal oxide semiconductors (PMOS) transistors 401 and 402. In some embodiments, each of the P-type regions may be a heavily-doped P-type semiconductor (P+) region. More specifically, each P-type region may form a source or drain of the corresponding PMOS transistor 401 or 402. In the example of FIG. 4, the left-most P-type region of each PMOS transistor 401 and 402 is the source terminal (P$_S$) for that transistor, and the right-most P-type region of each PMOS transistor 401 and 402 is the drain terminal ($P_D$) for that transistor. The N-type substrate forms a channel between the P-type regions of each PMOS transistor 401 and 402, and a layer of oxide is provided on the surface of the channel to form the gate of the transistor.

Each P-N junction (e.g., the intersection between a P-type region and the N-type substrate) acts as a diode and thus facilitates a flow of charge from one region to another when a voltage is applied between the P-type region and the N-type substrate. Accordingly, the N-type substrate facilitates a flow of charge between the source and drain (e.g., P-type regions) of each PMOS transistor 401 and 402 when the corresponding transistor is properly biased. However, if the PMOS transistors 401 and 402 are too close to one another, the N-type substrate may also facilitate a flow of charge from the source of one PMOS transistor to the drain of a neighboring PMOS transistor (e.g., from $P_S$ of PMOS 401 to $P_D$ of PMOS 402) when biased a certain way.

To prevent such undesired coupling between the PMOS transistors 401 and 402, the transistors may be separated by at least a threshold distance (referred to herein as a "junction isolation distance"). For example, the junction isolation distance may be the minimum distance of separation needed to prevent the P-N junction of one PMOS transistor from overlapping or otherwise forming a channel with the P-N junction of a neighboring PMOS transistor. In the example of FIG. 4, the junction isolation distance may be the minimum distance needed to separate the drain $P_D$ of the first PMOS transistor 401 from the source $P_S$ of the second PMOS transistor 402 in order to ensure that the transistors 401 and 402 are electrically isolated from one another.

It is noted that, although two PMOS transistors 401 and 402 are depicted in the example of FIG. 4, the junction isolation distance may apply to any integrated circuit components (e.g., PMOS transistors, NMOS transistors, diodes, etc.) that are disposed on the same substrate. As a result, the number of circuit components that can be formed on a semiconductor wafer or die may be limited by the junction isolation distance needed to separate each of the circuit components. This problem may be more pronounced in analog circuitry (e.g., than digital circuitry), as larger circuit components may require larger junction isolation distances than smaller circuit components.

Aspects of the present disclosure recognize that an electrical insulator (such as an oxide material) may better isolate neighboring circuit components (such as PMOS transistors 401 and 402) than a semiconductor (such as the N-type substrate). Furthermore, the thickness of an insulator may be substantially less than the thickness of a semiconductor needed to provide the same degree of electrical isolation. Thus, in some embodiments, the circuit components of a 3D device may be electrically isolated using an insulator material (e.g., silicon dioxide or other oxide material) in lieu of junction isolation techniques.

Figure 5:
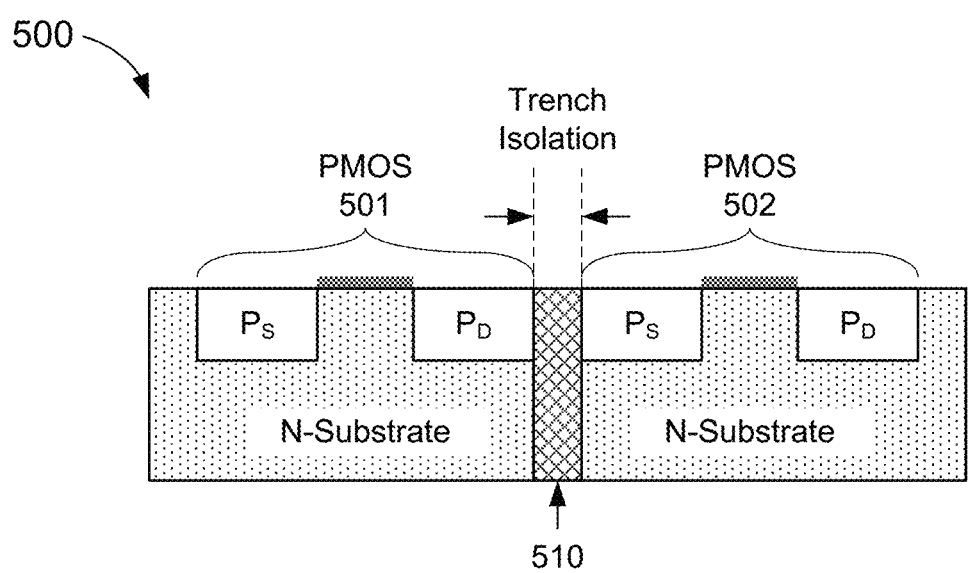
FIG. 5 shows a cross-sectional view of a semiconductor wafer in which neighboring circuits using an electrical insulator, in accordance with some embodiments.

FIG. 5 shows a cross-sectional view of a semiconductor wafer 500 in which neighboring circuits are separated using an electrical insulator, in accordance with some embodiments. The semiconductor wafer 500 may be an example embodiment of the first IC wafer 120A or the second IC wafer 120B of FIG. 1. Thus, in some embodiments, the semiconductor wafer 500 may include the digital circuit components of a 3D IC device (e.g., corresponding to digital circuitry 122). In other embodiments, the semiconductor wafer 500 may include the analog circuit components of a 3D IC device (e.g., corresponding to analog circuitry 124).

The semiconductor wafer 500 is formed from an N-type (negatively-doped) semiconductor substrate. Two P-type (positively-doped) semiconductor regions are deposited on either side of the substrate to form respective PMOS transistors 501 and 502. In some embodiments, each of the P-type regions may be a heavily-doped P-type semiconductor (P+) region. More specifically, each P-type region may form a source or drain of the corresponding PMOS transistor 501 or 502. In the example of FIG. 5, the left-most P-type region of each PMOS transistor 501 and 502 is the source terminal ($P_S$) for that transistor, and the right-most P-type region of each PMOS transistor 501 and 502 is the drain terminal ($P_D$) for that transistor. The N-type substrate forms a channel between the P-type regions of each PMOS transistor 501 and 502, and a layer of oxide is provided on the surface of the channel to form the gate of the transistor.

In some embodiments, an electrical insulator 510 (e.g., an oxide material) is deposited between the PMOS transistors 501 and 502. More specifically, the electrical insulator 510 may be provided between the drain Po of the first PMOS transistor 501 and the source $P_S$ of the second PMOS transistor 502. The insulator 510 may form an electrical barrier between the neighboring PMOS transistors 501 and 502, preventing the flow of charge from one of the transistors to the other (e.g., from $P_S$ of PMOS 501 to $P_D$ of PMOS 502). In some embodiments, the insulator 510 may be trenched through the entire thickness of the substrate to fully isolate or wall-off the first PMOS transistor 501 from the second PMOS transistor 502. For example, the electrical insulator 510 may be exposed on either side of the wafer 500, causing the N-type substrate to be bifurcated into separate and distinct regions coinciding with respective PMOS transistors 501 and 502. As a result of this "trench isolation," the N-type substrate cannot form a channel between the PMOS transistors 501 and 502.

It is noted that the electrical insulator 510 may effectively isolate the first PMOS transistor 501 from the second PMOS transistor 502 with a significantly smaller degree of separation between the transistors compared to junction isolation techniques (e.g., as shown in FIG. 4). This may allow for a greater number and/or density of circuit components to be formed on the semiconductor wafer 500 than would otherwise be possible using junction isolation techniques. For example, using the trench isolation techniques described herein, the spacing between 6V transistors (e.g., analog circuitry) may be reduced from 10 μm (e.g., the junction isolation distance) to 0.5 μm. Although two PMOS transistors 501 and 502 are depicted in the example of FIG. 5, the trench isolation techniques may be applied to any integrated circuit components (e.g., PMOS transistors, NMOS transistors, diodes, etc.) that are disposed on the same substrate.

As described above, in order to achieve the maximum benefits of trench isolation, the electrical insulator 510 should be trenched through the entire thickness of the substrate. However, it may not be feasible or cost-effective to deposit the electrical insulator 510 through the depth of a conventional semiconductor wafer (such as wafer 110A or 110B of FIG. 1). For example, the electrical insulator 510 may be formed by etching a trench into the semiconductor wafer and filling the trench with an oxide material (such as silicon dioxide). However, etching a trench through the entire thickness of a semiconductor wafer may compromise the structural integrity of the wafer (e.g., causing portions of the wafer to separate or break off). Furthermore, it may be difficult to fill the trench with oxide material once it has completely etched through the top and bottom surfaces of the wafer. Thus, in some embodiments, the electrical insulator 510 may be formed by etching a trench through the top surface the semiconductor wafer (e.g., without penetrating the bottom surface of the wafer), filling the trench with an oxide material, and removing layers of substrate from the bottom surface until the oxide trenches are exposed on the bottom surface of the semiconductor wafer. In some aspects, the layers of substrate may be removed using a backgrinding or CMP technique.

FIGS. 6A-6F show cross-sectional views 600A-600F of a semiconductor wafer 610 at various stages of a manufacturing process, in accordance with some embodiments. The semiconductor wafer 610 may be an example embodiment of the first IC wafer 120A or the second IC wafer 120B of FIG. 1. Thus, in some embodiments, the semiconductor wafer 610 may include the digital circuit components (e.g., corresponding to digital circuitry 122). In other embodiment embodiments, the semiconductor wafer 610 may include the analog circuit components (e.g., corresponding to analog circuitry 124).

Figure 6A:
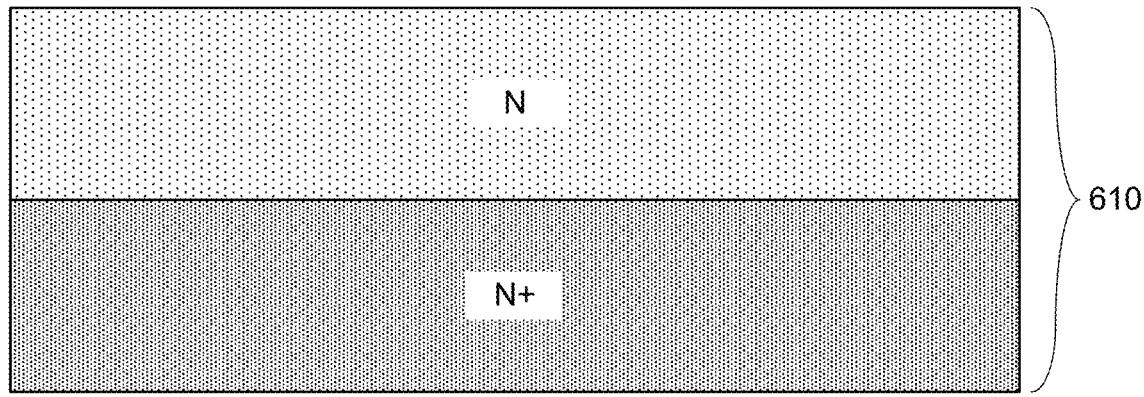
FIGS. 6A-6F show cross-sectional views of a semiconductor wafer at various stages of a manufacturing process, in accordance with some embodiments.

As shown in FIG. 6A, the semiconductor wafer 610 may comprise a lightly-doped N-type semiconductor region (N) formed on top of a heavily-doped N-type semiconductor substrate (N+). For example, the wafer 610 may be formed from a semiconductor material such as silicon. The N and N+ semiconductor regions may be formed using dopant gases, ion implantation, or any other suitable doping techniques. Although the semiconductor wafer 610 is shown to include an N-type semiconductor region formed on top of an N+ substrate, other doping configurations may be implemented with little or no modification to the process of FIGS. 6A-6F. For example, in some embodiments, the semiconductor wafer 610 may comprise a lightly-doped P-type semiconductor region (P) formed on top of a heavily-doped P-type semiconductor substrate (P+).

Figure 6B:
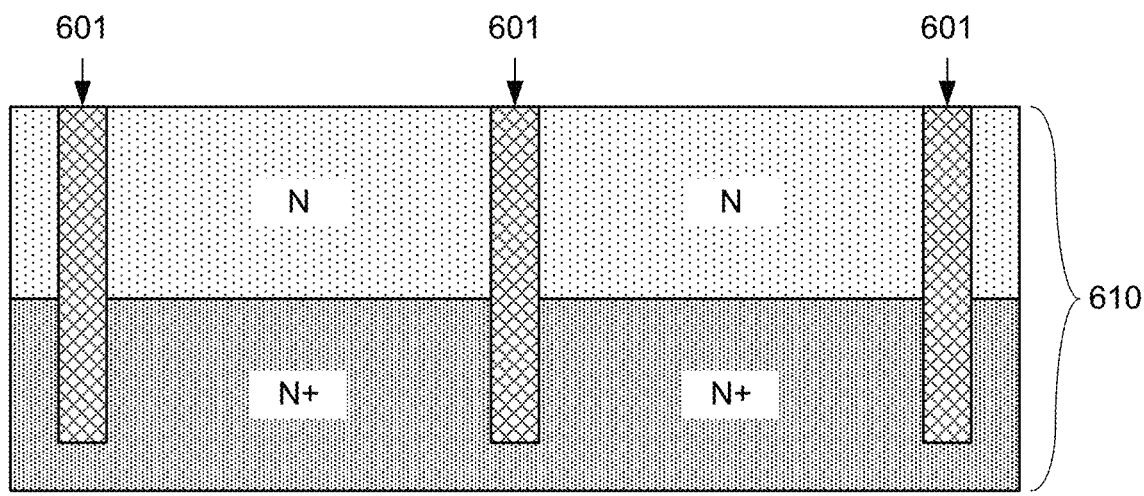

As shown in FIG. 6B, electrical insulators 601 are deposited in the semiconductor wafer 610. In some embodiments, the electrical insulators 601 may be formed by etching respective trenches into the semiconductor wafer 610 (e.g., at the locations of the insulators 601) and filling the trenches with an oxide material (such as silicon dioxide). In some aspects, the trenches may be etched to a depth below the N-type semiconductor region and into at least a portion of the N+ semiconductor substrate. However, the trenches may not be etched through the entire thickness of the semiconductor wafer 610 (e.g., trenches may not penetrate the bottom surface of the wafer 610). As described above, the electrical insulators 601 may be used to electrically isolate various circuit components of the semiconductor wafer 610. Thus, the number and configuration of electrical insulators 601 may depend on the number and configuration of the circuit components to be formed on the semiconductor wafer 610.

Figure 6C:
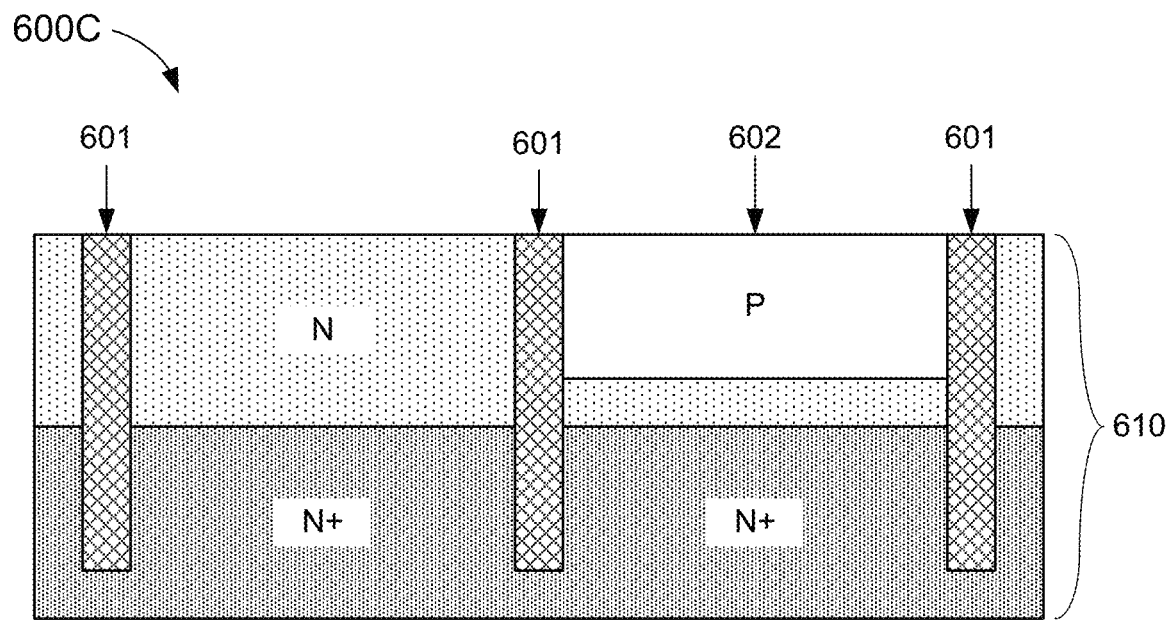

As shown in FIG. 6C, a P-type semiconductor region is implanted in the right-hand portion of the wafer 610. The P-type semiconductor region may be formed using dopant gases, ion implantation, or any other suitable doping techniques. In the example of FIG. 6C, the P-type semiconductor region may be deposited between a set of electrical insulators 601. Thus, at least one of the electrical insulators 601 may separate the N-type semiconductor region (on the left) from the P-type semiconductor region (on the right). More specifically, the electrical insulators 601 may prevent a P-N junction from being formed at an intersection of the N-type semiconductor region and the P-type semiconductor region. In some embodiments, the N-type semiconductor region may form an N-well (e.g., for PMOS transistors) and the P-type semiconductor region may form a P-well (e.g., for NMOS transistors).

Figure 6D:
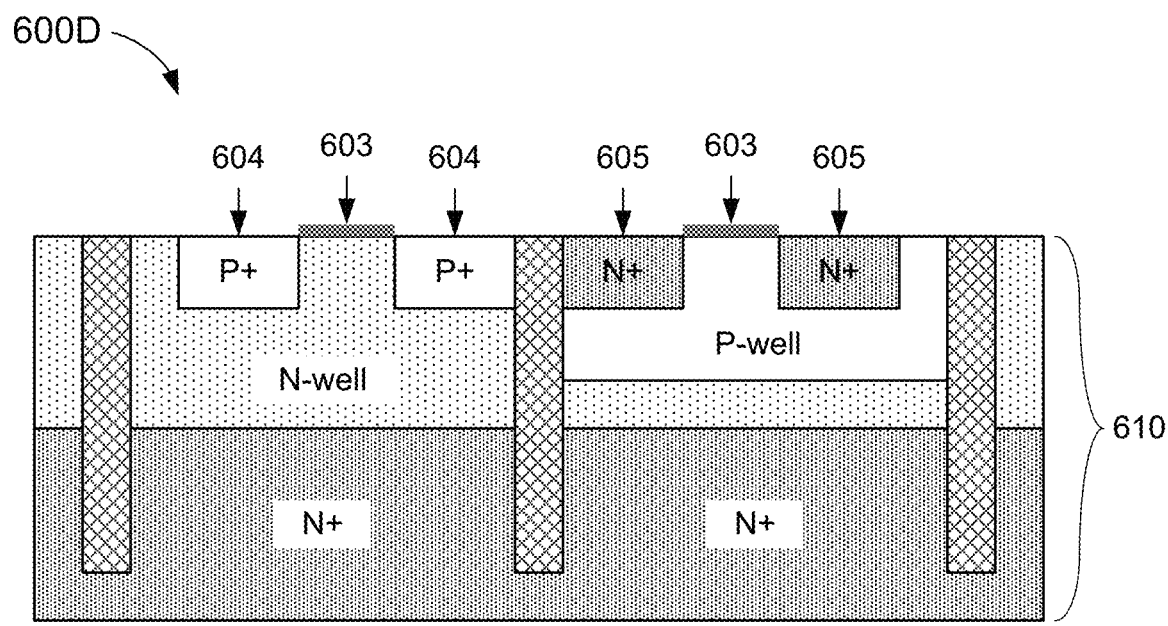

As shown in FIG. 6D, a PMOS transistor is formed in the left-hand portion of the wafer 610 and an NMOS transistor is formed on the right-hand portion of the wafer 610. For example, the PMOS transistor may be formed by implanting two heavily-doped P-type (P+) semiconductor regions 604 in the N-well to form respective source and drain terminals, where the N-well forms a channel between the source and drain of the PMOS transistor. The NMOS transistor may be formed by implanting two heavily-doped N-type (N+) semiconductor regions 605 in the P-well to form respective source and drain terminals, wherein the P-well forms a channel between the source and drain of the NMOS transistor. A layer of oxide 603 (such as silicon dioxide) is grown on the surface of the wafer 610 to form respective gate terminals for the PMOS transistor and NMOS transistor. For example, after growing the layer of oxide 603 on the surface of the wafer 610, portions of the oxide 603 may be etched away leaving behind the gates above respective channels between the P-type regions 604 and N-type regions 605. In some embodiments, a layer of polysilicon (not shown for simplicity) may be formed above each of the gates to form respective gate contacts.

Figure 6E:
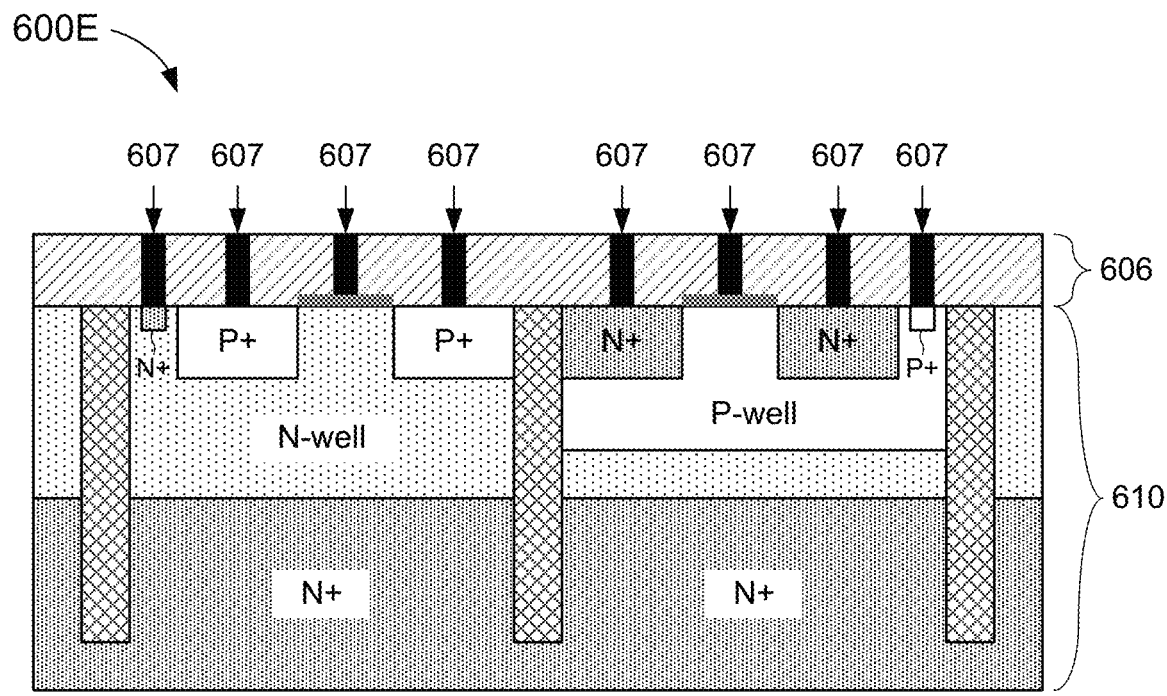

As shown in FIG. 6E, an intermediate layer of oxide 606 may be formed on the surface of the wafer 610. The intermediate oxide layer 606 may be used to seal off the top surface of the semiconductor wafer 610, for example, to protect the circuit components disposed thereon from shorting and/or forming undesired connections with other circuitry. A plurality of contacts 607 are formed in the intermediate oxide layer 606 to form electrical connections between the circuit components (e.g., PMOS transistor and NMOS transistor) of the wafer with external circuitry. For example, each of the contacts 607 may be formed by etching respective portions of the oxide layer 606 and depositing metal within the etched portions of the oxide layer 606 (or by any other means commonly known in the industry for creating contacts to silicon). In the example of FIG. 6E, a respective contact 607 is coupled to each of the N-well, the P-well, the P-type regions, the N-type regions, and the oxide gates. In some embodiments, heavily-doped N-type (N+) and P-type (P+) regions may be implanted in the N-well and P-well, respectively, to form ohmic contacts with one or more of the contacts 607. In some embodiments, the intermediate oxide layer 606 may additionally function as in interface between the semiconductor wafer 610 and another semiconductor wafer (not shown for simplicity) to be stacked and bonded on top of the wafer 610.

Figure 6F:
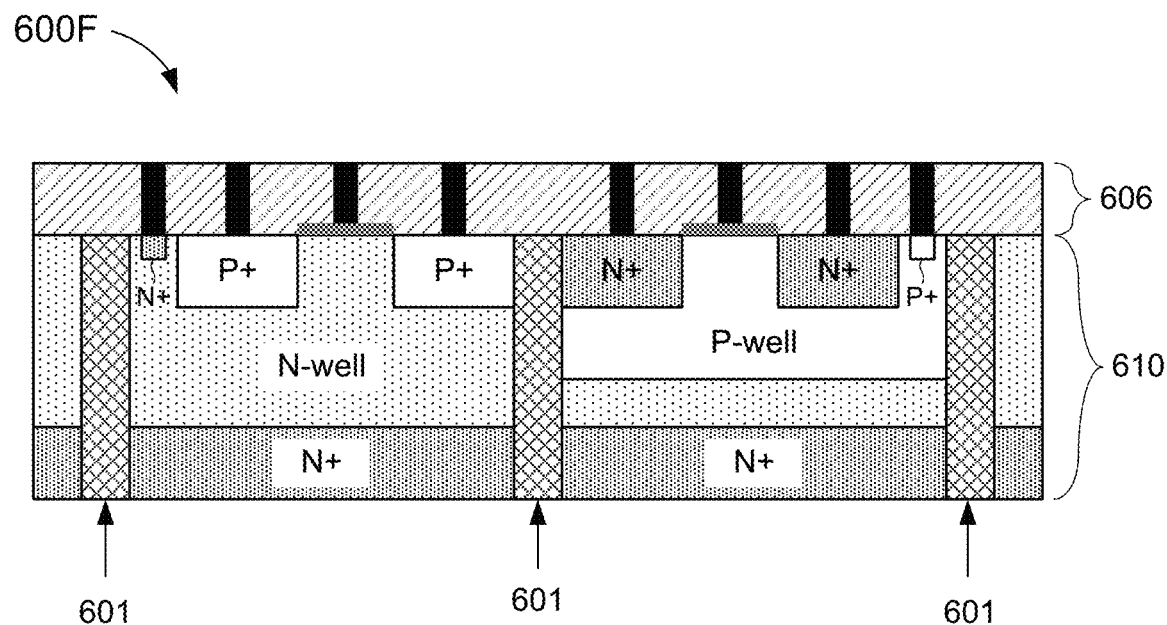

As shown in FIG. 6F, one or more layers of semiconductor material (e.g., corresponding to the N+ substrate) may be removed from the bottom surface of the wafer 610. For example, the layers of semiconductor material may be removed by backgrinding and/or polishing the bottom surface of the wafer 610 to a desired depth or thickness. It is noted that, prior to removing any layers of semiconductor material, the bottom surface of the wafer 610 may comprise a semiconductor substrate that is uniform throughout (e.g., with no exposed circuitry). In some embodiments, the bottom surface of the wafer 610 is grinded to at least the depth of the electrical insulators 601 (e.g., such that the electrical insulators 601 are exposed on the bottom surface of the wafer 610).

In some embodiments, a process control system (such as the process control system 300 of FIG. 3) may be implemented, at least in part, on the wafer 610 to thin the semiconductor substrate to the desired depth (e.g., to the depth of the electrical insulators 601). With reference for example to FIG. 3, the wafer measurement circuitry 310 may disposed on the wafer 610 to measure a resistance between the N-well and the P-well (or between the PMOS and NMOS transistors). In some aspects, the wafer measurement circuitry 310 may provide a feedback signal to the wafer-thinning system (e.g., via inductive coupling) indicating the measured resistance from the N-well to the P-well as layers of semiconductor substrate are removed from the bottom surface of the wafer 610. When the electrical insulators 601 become exposed on the bottom surface of the wafer 610, the resistance between the N-well and the P-well is expected to peak or plateau (e.g., indicating that the PMOS and NMOS transistors are electrically isolated from one another).

In some embodiments, when the electrical insulators 601 become exposed on the bottom surface of the wafer 610, the feedback signal may cause the wafer-thinning system to stop or cease the wafer-thinning process. Thus, in some aspects, the depth of the electrical insulators 601 may be used to control a depth of the wafer thinning process. As a result of the wafer thinning process, the N+ substrate may be bifurcated between the region containing the PMOS transistor and the region containing the NMOS transistor. Accordingly, the N+ substrate cannot form a channel between the PMOS transistor (on the left of the wafer 610) and the NMOS transistor (on the right of the wafer 610).

It is noted that, the process of FIGS. 6A-6F allows the circuit components of a semiconductor wafer to be electrically isolated using trench isolation techniques (e.g., as described with respect to FIG. 5). Thus, a greater number and/or density of circuit components may be formed on a single semiconductor wafer using the process of FIGS. 6A-6F in comparison to using conventional IC fabrication techniques (e.g., which rely on junction isolation). Although a single PMOS transistor and NMOS transistor is depicted in the example of FIGS. 6A-6F, the process described above may be used to fabricate any number of NMOS and/or PMOS transistors, including various other integrated circuit components (e.g., as described in greater detail below).

Aspects of the present disclosure also recognize that the surface of the wafer 610 may not be entirely planar (e.g., the surface may be uneven). As a result, different regions of the wafer 610 may be thinned at different rates. Thus, in some embodiments, the wafer measurement circuitry may be disposed over a plurality of different regions of the wafer 610 to measure the characteristics or properties of the wafer 610 at each of the different regions.

Figure 7:
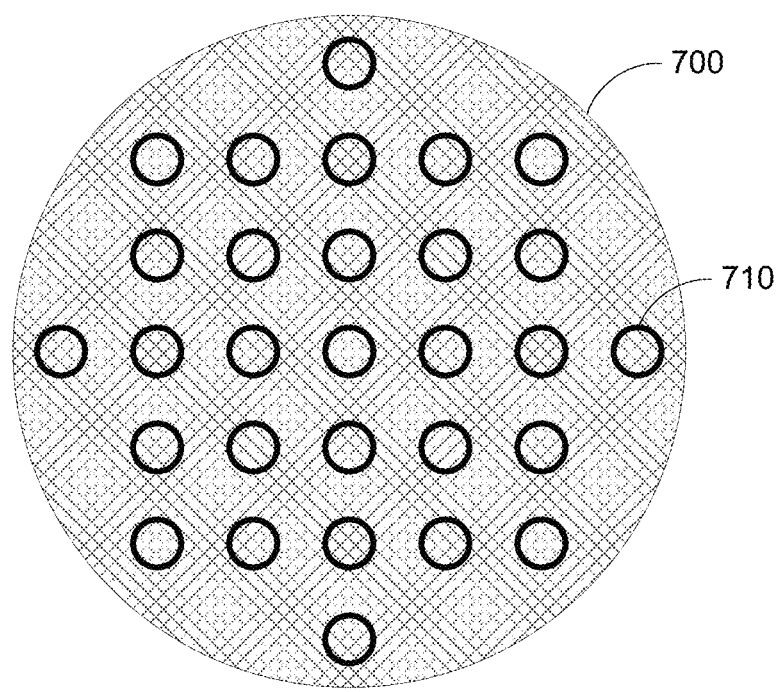
FIG. 7 shows an example semiconductor wafer with wafer-thinning feedback circuitry, in accordance with some embodiments.

FIG. 7 shows an example semiconductor wafer 700 with wafer-thinning feedback circuitry, in accordance with some embodiments. In the example of FIG. 7, the wafer-thinning feedback circuitry 710 is depicted as a plurality of rings (e.g., inductive coils) patterned across the wafer 700. More specifically, each of the circuits 710 may correspond to a respective wafer measurement circuit (such as wafer measurement circuitry 310 of FIG. 3) configured to measure one or more characteristics or properties of the wafer 700 at a particular region. In some embodiments, each of the circuits 710 may be paired (e.g., inductively coupled) with a respective thinning control circuitry (such as thinning control circuitry 320 of FIG. 3) residing on a wafer-thinning apparatus (not shown for simplicity). Accordingly, each of the circuits 710 may provide feedback to the wafer-thinning apparatus indicating a characteristic (e.g., thickness or resistance) of the wafer 700 in a corresponding region.

The wafer-thinning apparatus may monitor and control a wafer-thinning operation applied to the wafer 700 based on the measured characteristics of the wafer 700 at each of the different regions. More specifically, the wafer-thinning apparatus may determine when to stop or pause the wafer-thinning operation based on the feedback received from each of the circuits 710. For example, in some implementations, it may be desirable to avoid over-thinning any region of the wafer 700 (e.g., to prevent failure of the circuitry residing therein). Thus, in some aspects, the wafer-thinning apparatus may stop the wafer-thinning operation if the thickness of the wafer 700 in any particular region has been thinned down to a threshold thickness.

In some other implementations, it may be desirable to ensure that wafer 700 is thinned until electrical insulators (such as the electrical insulators 601 of FIGS. 6A-6F) are exposed in each region of the wafer 700 (e.g., to electrically isolate the circuitry disposed therein). Thus, in some other aspects, the wafer-thinning apparatus may stop the wafer-thinning operation only after the measured resistance of the wafer 700 has reached the threshold resistance in each region of the wafer 700. Still further, in some aspects, the wafer-thinning apparatus may stop the wafer-thinning operation once a threshold thickness and/or resistance has been reached in a threshold number of regions of the wafer 700 (e.g., including some, but not all, of the regions).

Figure 8:
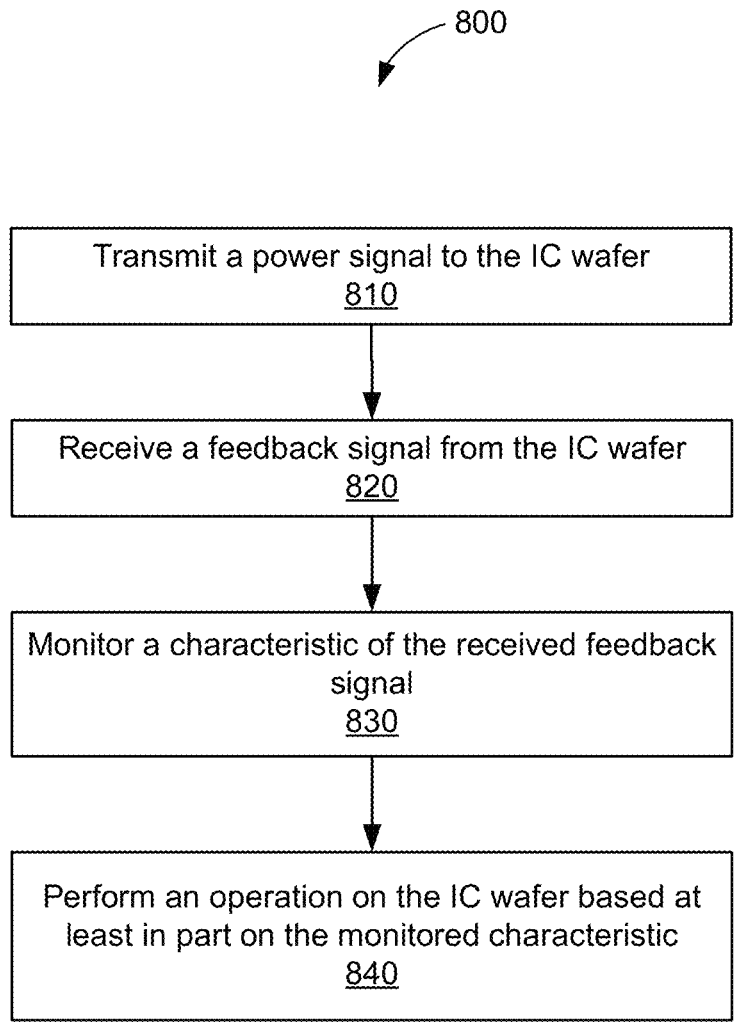
FIG. 8 is an illustrative flowchart depicting an example active process monitoring operation, in accordance with some embodiments.

FIG. 8 is an illustrative flowchart depicting an example operation 800 that may be performed on an IC wafer, in accordance with some embodiments. With reference for example to FIG. 2, the example operation 800 may be performed by an active process monitoring system, such as the wafer-thinning system 200, to monitor and control an operation performed on an IC wafer (e.g., wafer thinning).

The system may transmit a power signal to the IC wafer (810). For example, the power signal may be used to power circuitry residing on the IC wafer (such as the wafer measurement circuitry 310 of FIG. 3). In some embodiments, the power signal may be communicated wirelessly to the IC wafer (e.g., via inductive coupling). With reference for example to FIG. 3, the power source 322 may generate a power signal or current ($I_P$). The flow of current $I_P$ through the inductor L1 induces a corresponding current $I_P'$ through the inductor L2 of the wafer measurement circuitry 310 (e.g., when the IC wafer is being held or supported by the support structure of the wafer-thinning system), which powers the amplifier 312.

The system may further receive a feedback signal from the IC wafer (820). For example, at least some of the circuitry residing on the IC wafer may be used to measure one or more characteristics or properties of the wafer. With reference for example to FIG. 3, the wafer measurement circuitry 310 residing on the IC wafer may operate as an RC oscillator. In some embodiments, at least a portion of the resistance in each stage of the RC network may be measured across two (or more) points on the semiconductor substrate of the IC wafer. Thus, as layers of semiconductor material are removed from the surface of the IC wafer, the resistive component of the wafer measurement circuitry 310 may change. This change in resistance may be reflected in one or more characteristics of the feedback signal $I_{FB}$. In some embodiments, the feedback signal may be communicated wirelessly to the wafer-thinning system (e.g., via inductive coupling).

The system may monitor a characteristic of the received feedback signal (830). In some aspects, the wafer-thinning system may determine a thickness of the IC wafer based on the monitored characteristic of the received feedback signal. With reference for example to FIG. 3, it is noted that the oscillation frequency of the feedback signal $I_{FB}$ (and $I_{FB}'$) is directly proportional to the thickness of the IC wafer (e.g., the oscillation frequency decreases as the thickness decreases). In some other aspects, the wafer-thinning system may determine a resistance of the IC wafer based on the monitored characteristic of the received feedback signal. With reference for example to FIG. 3, it is noted that the oscillation frequency of the feedback signal $I_{FB}$ (and $I_{FB}'$) is inversely proportional to the thickness of the IC wafer (e.g., the oscillation frequency decreases as the resistance increases).

The system may perform an operation on the IC wafer based at least in part on the monitored characteristic (840). For example, a process controller residing on, or coupled to, the wafer-thinning system may ensure that the IC wafer is thinned until the measured characteristics (as indicated by the feedback signal) reach a desired threshold level. Furthermore, the process controller may prevent the wafer-thinning system from over-thinning the IC wafer. In some embodiments, the process controller may prevent the wafer-thinning system from removing additional layers of semiconductor material from the surface of the IC wafer once a threshold thickness has been reached. In some other embodiments, the process controller may prevent the wafer-thinning system from removing additional layers of semiconductor material from the surface of the IC wafer once a threshold resistance has been reached.

Figure 9:
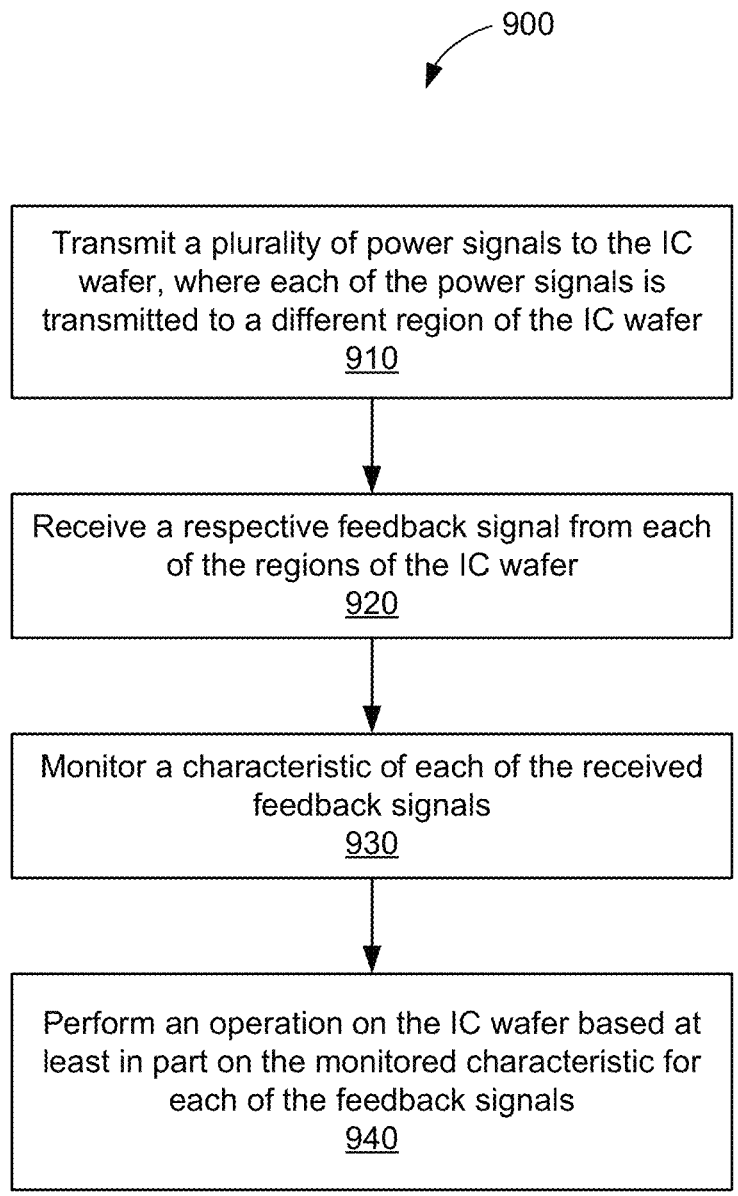
FIG. 9 is an illustrative flowchart depicting another active process monitoring operation, in accordance with some embodiments.

FIG. 9 is an illustrative flowchart depicting another example operation 900 that may be performed on an IC wafer, in accordance with some embodiments. With reference for example to FIG. 2, the example operation 900 may be performed by an active process monitoring system, such as the wafer-thinning system 200, to monitor and control an operation performed on an IC wafer (e.g., wafer thinning).

The system may transmit a plurality of power signals to the IC wafer, where each of the power signals is transmitted to a different region of the IC wafer (910). For example, each of the power signals may be used to power circuitry residing on a respective region of the IC wafer (such as the wafer-thinning feedback circuitry 710 of FIG. 7). In some embodiments, the power signals may be communicated wirelessly to the IC wafer (e.g., via inductive coupling). With reference for example to FIG. 3, the power source 322 may generate a power signal or current ($I_P$). The flow of current $I_P$ through the inductor L1 induces a corresponding current $I_P'$ through the inductor L2 of the wafer measurement circuitry 310 (e.g., when the IC wafer is being held or supported by the support structure of the wafer-thinning system), which powers the amplifier 312.

The system may further receive a respective feedback signal from each of the regions of the IC wafer (920). For example, circuitry residing on the IC wafer may be used to measure one or more characteristics or properties of the wafer at various regions. With reference for example to FIG. 3, the wafer measurement circuitry 310 residing on the IC wafer may operate as an RC oscillator. In some embodiments, at least a portion of the resistance in each stage of the RC network may be measured across two (or more) points on the semiconductor substrate of the IC wafer. Thus, as layers of semiconductor material are removed from the surface of the IC wafer, the resistive component of the wafer measurement circuitry 310 may change. This change in resistance may be reflected in one or more characteristics of the feedback signal $I_{FB}$. In some embodiments, the feedback signal may be communicated wirelessly to the wafer-thinning system (e.g., via inductive coupling).

The system may monitor a characteristic of each of the received feedback signals (930). In some aspects, the wafer-thinning system may determine a thickness of the IC wafer, at each region, based on the monitored characteristic of the received feedback signal for that region. With reference for example to FIG. 3, it is noted that the oscillation frequency of the feedback signal $I_{FB}$ (and $I_{FB}'$) is directly proportional to the thickness of the IC wafer (e.g., the oscillation frequency decreases as the thickness decreases). In some other aspects, the wafer-thinning system may determine a resistance of the IC wafer, at each region, based on the monitored characteristic of the received feedback signal for that region. With reference for example to FIG. 3, it is noted that the oscillation frequency of the feedback signal $I_{FB}$ (and $I_{FB}'$) is inversely proportional to the thickness of the IC wafer (e.g., the oscillation frequency decreases as the resistance increases).

The system may perform an operation on the IC wafer based at least in part on the monitored characteristic for each of the received feedback signals (940). For example, a process controller residing on, or coupled to, the wafer-thinning system may ensure that the IC wafer is thinned until the measured characteristics (as indicated by the feedback signal) reach a desired threshold level. Furthermore, the process controller may prevent the wafer-thinning system from over-thinning the IC wafer. In some embodiments, the process controller may stop the wafer-thinning operation if the thickness of the wafer in any particular region has been thinned down to a threshold thickness. In some other embodiments, the process controller may stop the wafer-thinning operation only after the measured resistance of the wafer has reached the threshold resistance in each region of the wafer. Still further, in some embodiments, the process controller may stop the wafer-thinning operation once a threshold thickness and/or resistance has been reached in a threshold number of regions of the wafer (e.g., including some, but not all, of the regions).

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

In the foregoing specification, embodiments have been described with reference to specific examples thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A system comprising:
a support structure to hold an integrated circuit (IC) wafer, the support structure including one or more inductive coils configured to:
  transmit a power signal inductively to the IC wafer, the power signal powering wafer measurement circuitry disposed in the IC wafer; and
  receive a feedback signal inductively from the wafer measurement circuitry on the IC wafer;
a mechanism configured to remove layers of material from a surface of the IC wafer; and
a process controller to monitor a characteristic of the received feedback signal and stop the mechanism from removing additional layers of the IC wafer when the monitored characteristic reaches a threshold level.

2. The system of claim 1, wherein the mechanism is configured to remove the layers of material using backgrinding or chemical mechanical polishing (CMP) techniques.

3. The system of claim 1, wherein the feedback signal is generated by a resistance-capacitance (RC) oscillator, provided on the IC wafer, in response to the power signal and the monitored characteristic is a frequency of the feedback signal, and wherein the process controller is configured to:
  stop the mechanism from removing additional layers of the IC wafer when the monitored frequency reaches a threshold frequency.

4. The system of claim 1, wherein the process controller is configured to:
  determine a resistance of the material based at least in part on the monitored characteristic; and
  stop the mechanism from removing additional layers of the IC wafer when the resistance of the material reaches a threshold resistance.

5. The system of claim 1, wherein the monitored characteristic indicates a thickness of the material, and wherein the process controller is configured to:
  determine a thickness of the IC wafer based at least in part on the monitored characteristic; and
  stop the mechanism from removing additional layers of the IC wafer when the thickness of the IC wafer reaches a threshold thickness.

6. A system comprising:
a support structure to hold an integrated circuit (IC) wafer, the support structure including one or more inductive coils configured to:
  transmit a plurality of power signals inductively to the IC wafer, the plurality of power signals powering a plurality of wafer measurement circuits disposed in the IC wafer, wherein each of the power signals is transmitted to a different region of the IC wafer; and
  receive a respective feedback signal inductively from each of the wafer measurement circuits on the IC wafer;
a mechanism configured to remove layers of material from a surface of the IC wafer; and
a process controller to monitor a characteristic of each of the received feedback signals and to stop the mechanism from removing additional layers of the IC wafer when the monitored characteristic for at least one of the received feedback signals reaches a threshold level.

7. The system of claim 6, wherein the mechanism is configured to remove the layers of material using backgrinding or chemical mechanical polishing (CMP) techniques.

8. The system of claim 6, wherein the process controller is configured to stop the mechanism from removing additional layers of the IC wafer when the monitored characteristic for each of the received feedback signals reaches the threshold level.

9. The system of claim 6, wherein each of the feedback signals is generated by a respective resistance-capacitance (RC) oscillator, provided on the IC wafer, in response to the respective power signal, and the monitored characteristic is a respective frequency for each of the feedback signals, and wherein the process controller is configured to:
  stop the mechanism from removing additional layers of the IC wafer when at least one of the monitored frequencies reaches a threshold frequency.

10. The system of claim 9, wherein the process controller is configured to stop the mechanism from removing additional layers of the IC wafer when each of the monitored frequencies reaches the threshold frequency.

11. The system of claim 6, wherein the process controller is configured to:
  determine, for each of the received feedback signals, a resistance of the material in a corresponding region of the IC wafer based at least in part on the monitored characteristic; and
  stop the mechanism from removing additional layers of the IC wafer when the resistance of the material reaches a threshold resistance in at least one of the regions of the IC wafer.

12. The system of claim 11, wherein the process controller is configured to stop the mechanism from removing additional layers of the IC wafer when the resistance of the material reaches the threshold resistance in each of the regions of the IC wafer.

13. The system of claim 6, wherein the process controller is configured to:
  determine, for each of the received feedback signals, a thickness of the IC wafer in a corresponding region based at least in part on the monitored characteristic; and
  stop the mechanism from removing additional layers of the IC wafer when the thickness of the IC wafer reaches a threshold thickness in at least one of the regions.

14. The system of claim 13, wherein the process controller is configured to stop the mechanism from removing additional layers of the IC wafer when the thickness of the IC wafer reaches the threshold thickness in each of the regions.

* * * * *